United States Patent
Kumagai

[11] 4,000,055
[45] Dec. 28, 1976

[54] METHOD OF DEPOSITING NITROGEN-DOPED BETA TANTALUM

[75] Inventor: Henry Yasuo Kumagai, Lower Macungie Township, Lehigh County, Pa.

[73] Assignee: Western Electric Company, Inc., New York, N.Y.

[22] Filed: Dec. 15, 1972

[21] Appl. No.: 315,759

Related U.S. Application Data

[62] Division of Ser. No. 217,876, Jan. 14, 1972, Pat. No. 3,723,838.

[52] U.S. Cl. ............................................. 204/192
[51] Int. Cl.² ........................................ C01C 15/00
[58] Field of Search ........................... 204/192, 298

[56] References Cited
UNITED STATES PATENTS

| | | | |
|---|---|---|---|
| 3,258,413 | 6/1966 | Pendergast | 204/192 |
| 3,664,931 | 5/1972 | Gerstenberg | 204/298 |
| 3,714,013 | 1/1973 | Rairden | 204/192 |

OTHER PUBLICATIONS

A. H. Beck and M. Densham, Vacuum, vol. 21, No. 5, "Addendum, A simple apparatus for DC bias sputtering, Apr. 5, 1971, p. 178.
Axelrod et al., Journal of the Electrochemical Society, vol. 116, Apr. 1969, pp. 460 to 465.
F. Vratney et al., Electrochemical Technology, vol. 5, p. 283 (1967).
D. Gerstenberg et al., Proceedings Electronic Components Conference, Washington, D. C. (1967).

*Primary Examiner*—Oscar R. Vertiz
*Assistant Examiner*—Wayne A. Langel
*Attorney, Agent, or Firm*—J. Rosenstock

[57] ABSTRACT

A method for forming a nitrogen doped-beta tantalum thin film which comprises sputtering tantalum in a nitrogen atmosphere such that the ratio of tantalum atoms to nitrogen atoms in the deposited film ranges from about 9/1 to about 999/1. Such films are useful in the fabrication of thin-film capacitors.

3 Claims, 4 Drawing Figures

METHOD OF DEPOSITING NITROGEN-DOPED BETA TANTALUM

This is a division of application Ser. No. 217,876 filed Jan. 11, 1972, now U.S. Pat. No. 3,723,838.

BACKGROUND OF THE INVENTION

1. Field of the Invention

This invention relates to a method of depositing nitrogen-doped beta tantalum and more particularly, to a method of depositing nitrogen-doped beta tantalum films for fabricating nitrogen-doped beta tantalum capacitors.

2. Description of the Prior Art

Electronic systems, particularly those in the communications industry, are rapidly becoming larger and more complex. With the development of increasingly more complicated electronic systems, the number of circuit components and necessary interconnections has increased many times over. The failure of even one component or of one lead connection can mean the failure of an entire system and an accompanying loss of service. Accordingly, components and interconnection techniques meeting reliability requirements of small systems may not be sufficiently reliable when connected in vast quantities in large, modern electronic systems.

Extensive research effort has been directed toward producing circuits and circuit elements which are reliable and stable in use and retain these characteristics over prolonged life periods. Tantalum integrated thin-film circuitry technology has evolved in response to this need.

Utilization of the thin-film technology inherently permits a substantial reduction in individual lead connections with accompanying increase in reliability. This reduction in individual lead connections is possible because a plurality of circuit components can frequently be formed on a single substrate from a single continuous film or from adjacent film layers inherently interconnecting the components. If the circuit components thus interconnected have the required reliability and stability, highly reliable and stable electronic systems can be built in this manner.

The stability and reliability of thin-film circuit components and therefore thin-film circuits depend to a considerable extent upon the material used to form the thin films. For this reason, there is a great need to find new materials for forming improved thin-film circuit elements. One such new material is beta tantalum which is revealed and described in U.S. Pat. No. 3,382,053, assigned to the assignee hereof and Bell Telephone Laboratories, Inc., and incorporated by reference hereinto and in U.S. Pat. No. 3,275,915, assigned to the assignee hereof and also incorporated by reference hereinto.

Pure beta tantalum is an excellent material for both thin-film capacitors and resistors. It has been found that another new material, nitrogen-doped beta tantalum permits even further improvement in tantalum thin-film component stability and reliability.

Nitrogen doping of beta tantalum refers to combining nitrogen atoms with tantalum atoms to form a beta tantalum crystalline structure having the nitrogen atoms interstitially incorporated therewith or therein. It had been previously thought that depositing tantalum, under conditions whereby beta tantalum forms, in the presence of nitrogen atoms, present in even small quantities, i.e., nitrogen doping of the resultant tantalum deposit, caused the resultant deposited tantalum to transform from the belta tantalum crystalline phase to the body-centered cubic structure of bulk or $\alpha$ tantalum, with an accompanying drop in resistivity. However, it has been surprisingly found that such is not true and that nitrogen doping of beta tantalum can be carried out without changing the crystal structure of beta tantalum to body-centered cubic and without forming other tantalum-nitrogen compounds of distinct crystalline structure such as $Ta_2N$ (hexagonal close packed) or $TaN$ (sodium chloride structure). It has also been surprisingly found that nitrogen doping of beta tantalum increases the resistivity thereof rather than decreases it.

SUMMARY OF THE INVENTION

This invention relates to a method of depositing nitrogen-doped beta tantalum and more particularly, to a method of depositing nitrogen-doped beta tantalum films for fabricating nitrogen-doped beta tantalum capacitors.

Briefly, the inventive technique involves depositing a thin-film electrode comprising nitrogen-doped beta tantalum (N-doped) upon a suitable electrically non-conductive substrate. A selected area of the electrode is oxidized to form a dielectric covering film of oxidized N-doped beta tantalum. A counterelectrode is then deposited over the dielectric film, thereby resulting in forming a capacitor having improved capacitor ability as evidenced by lower leakage currents.

DESCRIPTION OF THE DRAWINGS

The present invention will be more readily understood by reference to the following drawings taken in conjunction with the detailed description, wherein.

DETAILED DESCRIPTION

The present invention has been described mainly in terms of cathodic sputtering of nitrogen-doped (N-doped) beta tantalum thin films for fabricating capacitors. However, it will be understood that such description is exemplary only and is for purposes of exposition and not for purposes of limitation. The N-doped beta tantalum material can be deposited utilizing any conventional vapor phase technique including evaporation and chemical vapor deposition techniques as well as cathodic sputtering. In this regard, the N-doped beta tantalum may be sputtered from any standard cathode sputtering apparatus known in the art, including direct current, e.g., conventional bell-jar apparatus, and alternating current (high frequency and otherwise) apparatus, which may or may not be electrically biased. Also, it is to be understood that the inventive methods and resultant N-doped tantalum material can be employed wherever undoped beta tantalum can be employed, e.g., in resistor fabrication.

By the term N-doped beta tantalum is meant a combination of tantalum atoms and nitrogen atoms forming a beta tantalum crystal structure having nitrogen atoms interstitially incorporated therewith or therein. The crystal structure and properties of beta tantalum are revealed and discussed in U.S. Pat. No. 3,382,053 and U.S. Pat. No. 3,295,915, previously referred to.

Figure 1:
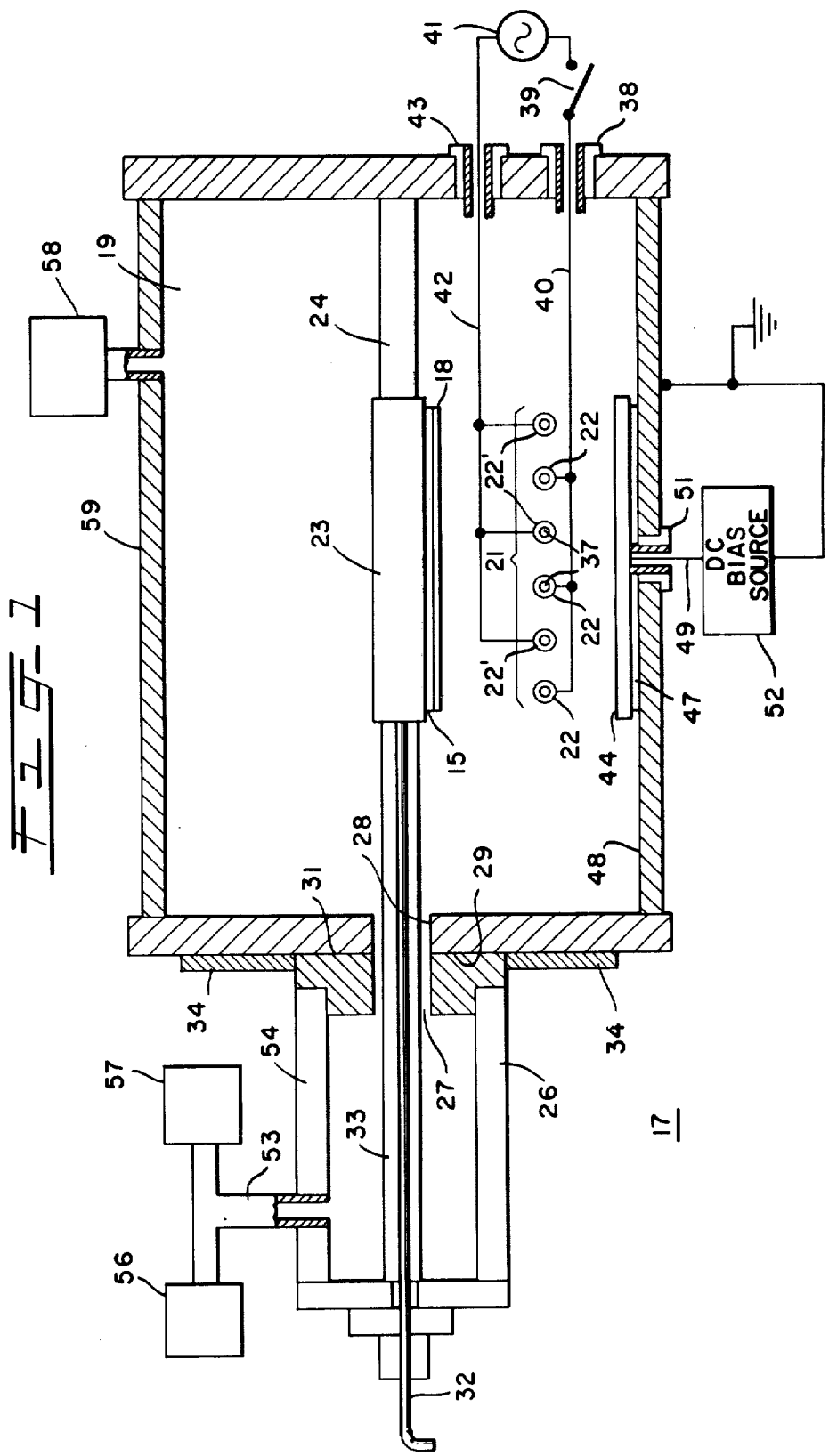
FIG. 1 is a cross-sectional view of a typical AC sputtering apparatus.

With reference to FIG. 1, there is shown a simplified cross-sectional view of a typical AC sputtering apparatus 17 which has DC biasing provided therein and which is suitable for depositing a continuous film 18 of N-doped beta tantalum on a nonconductive substrate 15, e.g., glass, ceramic. The sputtering apparatus 17 includes a rectangular sputtering chamber 19 formed from a conductive material, e.g., steel, which is electrically grounded, i.e., at earth potential. Extending through the chamber 19 is a target array 21 comprising a planar array of elongated, mutually parallel cylindrical tantalum elements 22–22' extending horizontally in the chamber 19. The elements 22–22' comprise high purity tantalum and are electrically insulated from the sputtering chamber 19. The elements 22–22' extend completely through the chamber 19 and penetrate opposed vertical walls thereof through standard sealing means, e.g., vacuum gaskets and seals and ceramic insulators.

The plane of the array of elements 22–22' is parallel to and transversely spaced from the plane of the substrate 15 which is disposed and supported within the chamber 19, at a predetermined distance from the array of elements 22–22', typically about 2½ inches, by means of a conventional substrate carrier 23. The substrate carrier 23 is in turn supported by a pair of identical metallic, channel-shaped tracks 24 (only one of which is shown) which are mounted above the array 21 and which extend longitudinally through the sputtering chamber 19. The tracks 24 are fixedly supported within the sputtering chamber 19 by conventional means known in the art. The tracks 24 are for movably supporting the substrate carrier 23 within the sputtering chamber 19. The substrate carrier 23 may be longitudinally advanced from an auxiliary chamber 26 which abuts the sputtering chamber 19 and is movably affixed thereto. Chamber 26 communicates with chamber 19 through a conduit 27 which mates with a conduit 28 of the sputtering chamber 19. Faces 29 and 31 of chambers 19 and 26, respectively, are vacuum sealing and the surfaces defining conduits 27 and 28 are maintained vacuum sealed by conventional means (not shown), e.g., by the use of O-ring seals.

The substrate carrier 23 is advanced by means of a push rod 32, to which the carrier 23 is affixed which can extend completely through the auxiliary chamber 26 into the sputtering chamber 19 when conduits 27 and 28 are aligned or mated. The auxiliary chamber 26 also has a pair of identical metallic channel-shaped tracks 33 (only one of which is shown) which mate with tracks 24 when the conduits 27 and 28 are aligned. These tracks 33 are for movably supporting the substrate carrier 23 when it is contained in the auxiliary chamber 26.

The auxiliary chamber 26 is intended for loading and unloading the substrate 15, as a holding chamber during pre-sputtering and as a heating chamber for the substrate 15. The auxiliary chamber 26 is movably mounted on guide rails 34 which are affixed to the sputtering chamber 19 whereby the auxiliary chamber 26 can be moved in an upper position (not illustrated), prior to loading of the sputtering chamber 19, and locked thereat by conventional means (not shown), e.g., a clamp. When loading of the sputtering chamber 19 is to take place, the auxiliary chamber 26 is moved to a lower position (as illustrated), and locked thereat by conventional means (not shown), e.g., a clamp. A heating means (not shown) for heating the substrate 15 is provided in the auxiliary chamber 26.

Each of the elements 22–22' is uniformly spaced from one another and is tubular in shape with a uniform diameter. Each of the elements 22–22' includes a central bore 37 through which a suitable coolant (not shown) may be passed during a sputtering operation, to which the substrate 15 is destined to be subjected. The coolant is provided to prevent excessive heating and/or melting of the tantalum elements 22–22'. Elements 22 are electrically connected in common by a conventional conductive means 40 which extends through an electrically isulative vacuum-tight support 38, through a switch 39, to one terminal of a conventional high voltage AC source 41 that is electrically isolated from the walls of the chamber 19. The remaining elements 22' are electrically connected in common to the other terminal of the AC source by conventional conductive means 42 which extends into chamber 19 through an electrically insulative vacuum-tight support 43. Thus, essentially all of a source potential may be applied across adjacent elements 22–22' in the array 21 to provide an intensive oscillating electric field between the adjacent elements 22–22'. During the half cycle of the applied AC voltage when the elements 22 are negative with respect to the remainder of the elements 22', the elements 22 constitute a cathodic source of tantalum, i.e., a tantalum cathode of the sputtering apparatus. Similarly, when the tantalum elements 22' are negative with respect to elements 22, the elements 22' constitute the cathode. In this way, each of the elements 22–22' constitutes a cathodic source of the sputtering apparatus 17. A separate anode of the type generally employed to support the substrate 15 in conventional diode sputtering apparatus is therefore not required.

In order to increase deposition rates and thus speed of processing, an auxiliary conductive bias member 44 is provided within the chamber 19 adjacent to the plane of the array 21. The member 44 is supported in parallel and electrical coupling relation to the array 21 by means of a dielectric bracket 47 affixed to the base 48 of the chamber 19. A conventional conductive means 49 extends upwardly from an electrically insulative vacuum-tight support 51 through the base 48 and is affixed to the plate 47. The conductive means 49 is affixed to an adjustable, grounded DC bias source 52. The member 44 is thus biased with a steady potential of selectable polarity from the bias source 52.

For any given pressure in the chamber 19, the use of the biased member 44 in conjunction with the AC-connected array 21 increases a cathode current density during the sputtering operation, to which the substrate 15 is destined to be subjected, in direct proportion to the voltage of the bias supply source 52 up to bias voltages of several hundred volts.

Reactive sputtering, as compared to non-reactive sputtering, takes place within a reactive atmosphere which may comprise a gas such as a nitrogen-containing gas, e.g., $N_2$, $NH_3$, etc. A gas inlet means 53 passes through a cover plate 54 of the auxiliary chamber 26 and communicates with the interior of the chamber 26. The gas inlet 53 is provided to introduce a non-reactive sputtering gas, e.g., argon, helium, neon, krypton, etc., from a gas source 56, into chamber 26 and ultimately into chamber 19, to condition the apparatus 17 for the sputtering operation. The gas inlet 53 is also provided to introduce the reactive nitrogen-containing gas, e.g., $N_2$, $NH_3$, etc., which is directed from a source 57 into inlet 53 and combines therein with the non-reactive gas, e.g., A, He, Ne, Kr, etc., to form a sputtering gas mixture. The gases of the gas mixture (inert and reactive) normally comprise a majority of electrically neutral gas molecules but during a sputtering operation, a portion of these molecules are ionized to produce positive ions and electrons, i.e., a plasma. A standard evacuation source 58, e.g., vacuum pump, passes through the cover plate 59 of chamber 19 and communicates with the interior of the chamber 19. The evacuation source 58 is provided to evacuate chambers 19 and 26 initially, during an inert gas flushing operation, during introduction of the sputtering gas mixture, and throughout the sputtering operation.

In operation, the top plate 54 of the auxiliary chamber 19 is removed and the substrate 15 is placed on the carrier 23 which is initially maintained in the auxiliary chamber 26. The top plate 54 is replaced and the auxiliary chamber 26 and the sputtering chamber 19 are then evacuated by means of the vacuum source 58, typically to approximately $2 \times 10^{-6}$ torr. Chambers 19 and 26 are then flushed with an inert gas, as for example, any of the members of the rare gas family such as helium, argon, or neon, from source 56 through inlet 53. The chambers 19 and 26 are then re-evacuated, i.e., a low-pressure ambient is maintained therein. The substrate 15 is then heated in the auxiliary chamber 26 by conventional means (not shown) to a suitable initial temperature, typically 400° C for a pre-sputtering period of time ranging from 15 to 45 minutes whereafter the substrate 15 is cooled to a suitable sputtering temperature, typically 200° C. The substrate 15 is then moved into the sputtering chamber 19 by means of the push rod 32 which moves the carrier 23 and substrate 15 along tracks 33 through the conduit 27, through the conduit 28 on tracks 24 and into the deposition chamber 19. The reactive nitrogen-containing gas, e.g., $N_2$, is conducted from source 57 at a predetermined flow rate, e.g., 0.6 cc/min; and combined with the inert gas, e.g., argon, which is conducted from source 56 at a predetermined flow rate, e.g., 25 cc/min., to form a reactive gas mixture, e.g., a gas mixture comprising 2.3 percent by volume $N_2$, remainder argon, and introduced into chambers 26 and 19 at a predetermined flow rate, e.g., 25 cc/min., through inlet 53, to raise the pressure to a predetermined value, e.g., typically $30 \times 10^{-3}$ torr.

After the requisite pressure is obtained, e.g., $30 \times 10^{-3}$ torr., the switch 39 in series with the AC source 41 is closed to apply the high AC voltage of the source 41 between adjacent ones of the elements 22–22'. The resulting electric field, e.g., 5,000 volts AC(RMS) between the adjacent elements 22–22' ionizes the introduced gases (inert and reactive) to create a current, e.g., 500 ma at a voltage of 5,000 volts and a pressure of $30 \times 10^{-3}$ torr., so that positive ions of the gas bombard those elements that are relatively negative at that moment. Voltage, e.g., −200 volts DC, is applied to the biased member 44 which is used in conjunction with the AC-excited element array 21 and increases the cathode current density, e.g., by 60% at a cathode voltage of 5 kV AC (RMS) and a current of 500 ma and pressure of $30 \times 10^{-3}$ torr.

The resultant bombardment causes a plurality of discrete surface tantalum atoms or particles of the bombarded elements 22–22' to be ejected therefrom and combine with the nitrogen atoms, contained in the reactive gas mixture, e.g., 2.3 volume percent nitrogen, remainder argon ($N_2$ introduced at a rate of 0.6 cc/min.). The combined tantalum and nitrogen atoms are then deposited e.g., at a rate of 350A/min. at 5,000 volts AC, field bias of −200 volts DC and pressure of $30 \times 10^{-3}$ torr., on the substrate 15 to form layer 18 comprising N-doped beta tantalum.

Figure 2:
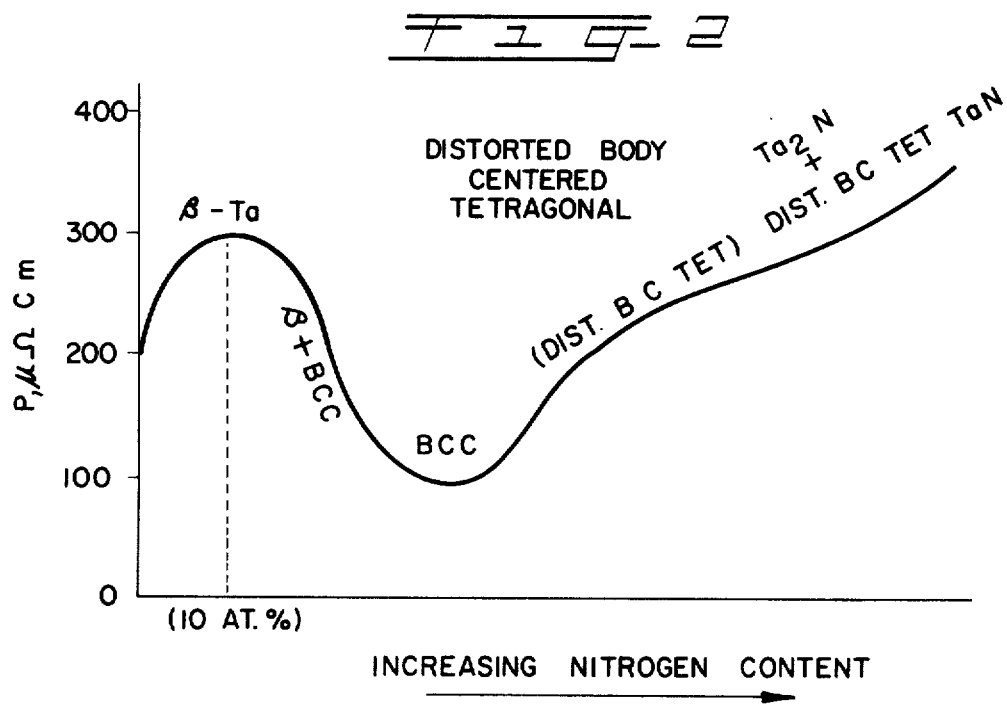
FIG. 2 is a graphical representation on coordinates of electrical resistivity in micro-ohm-cm. against increasing nitrogen content showing the variations of resistivity at 25° C of sputtered tantalum films having a thickness of at least 1,000 angstrom units.

It is of course to be understood that various AC sputtering parameters, having a broad range, may be employed to obtain N-doped beta tantalum and the parameters given above are exemplary only and not limiting. The various parameters are well known in the sputtering art and their interdependency, with respect to producing essentially only N-doped beta tantalum without producing b.c.c. tantalum or other tantalum-nitrogen compounds of distinct crystalline structure, e.g., $Ta_2N$ (hexagonal close packed), TaN (sodium chloride structure), can be easily ascertained by one skilled in the art. The various AC sputtering parameters are not critical except for the ratio of tantalum atoms to nitrogen atoms existing during the sputtering. It is essential that the amount of nitrogen atoms introduced into the system, in the form of a reactive nitrogen containing gas, e.g., $N_2$, $NH_3$, etc., and combined with the tantalum atoms does not exceed an upper limit which converts the beta tantalum crystalline structure into the body-centered cubic structure. Such a conversion can be easily ascertained by constantly monitoring the sheet resistivity of the resultant sputtered films since there is a sharp drop of sheet resistivity when the N-doped beta tantalum is being converted to the body-centered cubic structure as is shown in FIG. 2.

The nitrogen contained in the resultant N-doped sputtered film, having a beta tantalum crystalline structure, is present therein in an effective amount, ranging from a minimum, which is more than an incidental impurity concentration, to a maximum, that raises the sheet resistivity of the resultant sputtered film above that of undoped beta tantalum (essentially nitrogen free), sputtered under identical sputtering parameters. Typically, the nitrogen concentration present in the resultant sputtered film may range from trace amounts, e.g., about 0.1 atomic percent, to about 10 atomic percent of nitrogen, whereby a N-doped beta tantalum film is obtained without conversion to a b.c.c. structure. In other words, where vapor deposition techniques are employed, e.g., reactive sputtering, the rato of tantalum atoms to nitrogen atoms which impinge on a substrate surface typically ranges from about 9 to 999/1. It is to be understood and stressed that such a nitrogen concentration is exemplary only and not limiting and that greater concentrations of nitrogen may be incorporated in the resultant sputtered film, whereby the beta tantalum structure and improved nitrogen doping properties thereof are obtained.

The structural properties of the resultant nitrogen-doped beta tantalum film appear to be similar to those of pure undoped beta tantalum, as described in U.S. Pat. No. 3,382,053 and U.S. Pat. No. 3,275,915, previously referred to. Measurements by X-ray diffraction indicate that nitrogen incorporation (doping) into the resultant deposited film produces little effect on the crystalline structure of the film.

Nitrogen-doped beta tantalum may also be produced in a closed-end vacuum machine of the type disclosed in U.S. Pat. No. 3,521,765, assigned to the assignee hereof and incorporated by reference hereinto. This closed-end machine employs an entrance and an exit air lock, through which a continuous flow of substrates, on which nitrogen-doped beta tantalum is to be sputtered, passes. Each substrate is introduced through the entrance air lock and is carried, by a conveyor chain, into a central sputtering or deposition chamber, where it receives a coating of sputtered material. The substrate then passes into the exit air lock and is removed.

The substrates, e.g., glass, ceramics, are passed through the deposition chamber generally parallel to a tantalum cathode at a distance of from 2½ to 3 inches from the cathode. The cathode is generally rectangular in shape and has a width, i.e., the dimension transverse to the direction of travel of the substrates, from 5 to 6 inches greater than the width of the substrates. The substrates are driven past the cathode in a centered relationship with respect to the width of the cathode so that the cathode extends from 2½ to 3 inches beyond either side of the substrates. Before entering the deposition chamber the substrates are outgassed by preheating in vacuo for about 10 minutes at a temperature above 150° C.

In operation, the deposition chamber is pumped down to approximately $2 \times 10^{-6}$ torr. Again, a reactive gas mixture, e.g., 1.8 volume percent $N_2$ (the $N_2$ being introduced typically at a flow rate of 0.8 cc/min.), remainder argon, is introduced into the deposition chamber, e.g., at a flow rate of 45 cc/min., to bring the pressure up to a predetermined value, e.g., $30 \times 10^{-3}$ torr. After the requisite pressure is obtained, e.g., $30 \times 10^{-3}$ torr., DC voltage, e.g., 5,000 volts, is impressed between the substrate and the cathode. This voltage impression produces a plasma, i.e., ionizes the gases (inert and reactive) contained in the gaseous mixture, whereby a sputtering cathode current density, e.g., $2mA/in.^2$, at a voltage of 5,000 volts DC and pressure of $30 \times 10^{-3}$ torr., is created and depositions, e.g., at a rate of 200A/min., at 5,000 volts DC, $30 \times 10^{-3}$ torr, and 1.8 ma/in$^2$, of a N-doped beta tantalum film on the substrate is obtained.

Again, it is to be understood that various DC sputtering parameters, having a broad range, may be employed to obtain nitrogen-doped beta tantalum and the parameters given above are exemplary only and not limiting. The various sputtering parameters are well known in the sputtering art and the interdependency, with respect to producing essentially only N-doped beta tantalum which is essentially free of b.c.c. tantalum or other tantalum-nitrogen compounds, e.g., $Ta_2N$, can be easily ascertained by one skilled in the art. The various DC sputtering parameters are not critical, provided, of course, that the parameter of nitrogen atom concentration, as compared to the tantalum atom concentration, incorporated into the system and the resultant film is controlled (as discussed previously and graphically illustrated in FIG. 2).

It is again to be noted and stressed that although an AC sputtering apparatus and method and a DC sputtering apparatus and method of depositing N-doped beta tantalum have been described, nitrogen-doped beta tantalum may be produced using any conventional AC or DC apparatus and method as well as any conventional gas phase deposition technique including evaporation and vapor phase chemical deposition techniques.

It is to be understood that a source of nitrogen, e.g., a solid nitride, may be combined with the tantalum, e.g., by sintering, to form the elements 22–22′, having a proper nitrogen atom-to-tantalum atom ratio, whereupon bombardment thereof during the sputtering operation will produce the desired nitrogen-doped beta tantalum layer 18. It is also to be understood that like beta tantalum, an alloy comprising nitrogen-doped beta tantalum and at least one other suitable material, metallic or non-metallic, may be formed by co-sputtering thereof.

Figure 3:
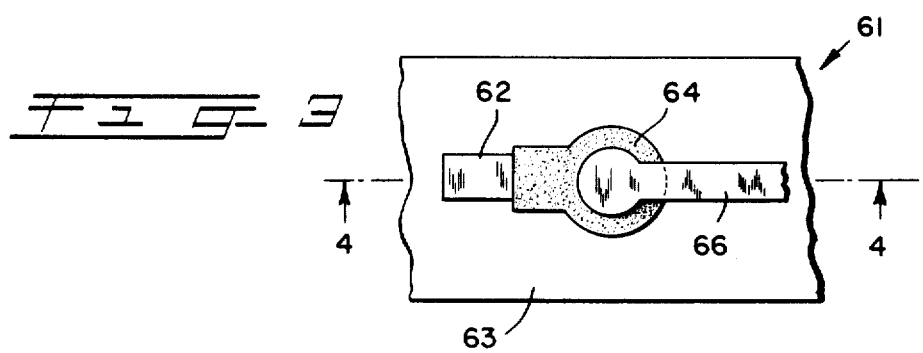
FIG. 3 is a plan view of a thin-film capacitor fabricated according to this invention.
Figure 4:
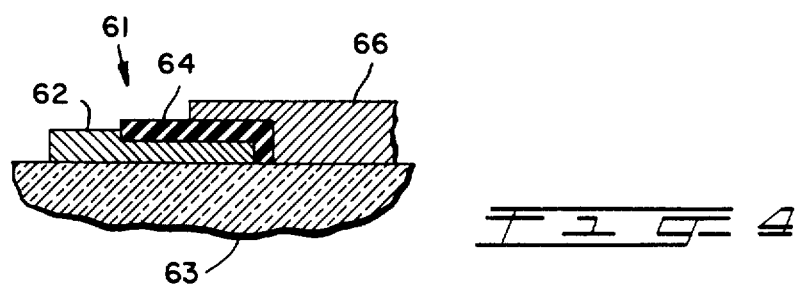
FIG. 4 is a sectional view taken along lines 4—4 of FIG. 3.

FIGS. 3 and 4 illustrate a typical thin-film capacitor generally indicated by the numeral 61. Capacitor 61 includes a base electrodes 62, preferably comprising a thin film of nitrogen-doped beta tantalum, deposited upon a suitable dielectric substrate 63, e.g., glass, ceramic. A dielectric film 64 comprising oxidized beta tantalum, preferably oxidized N-doped beta tantalum, covers a selected area of electrode 62 and a counterelectrode 66, e.g., a gold counterelectrode, having a nichrome (80 weight percent nickel, 20 weight percent chromium) adhesion layer, overlies the dielectric film 64. The dielectric film 64 separates the electrodes 62 and 66 to form the thin-film capacitor 61.

In the fabrication of the capacitor 61, comprising a dielectric film of an oxidation product of N-doped beta tantalum, a nitrogen-doped beta tantalum layer is first deposited on the substrate 63, utilizing techniques and apparatus described previously. The N-doped beta tantalum layer deposited on the substrate 63 is then shaped to conform to the electrode 62 by conventional means, e.g., etching. A preferred shaping method is disclosed in U.S. Pat. No. 3,391,373, which reveals a photoetching technique. Subsequent to shaping the electrode 62, the dielectric film 64 is readily formed by anodizing a selected area of the electrode 62. A suitable anodizing process which may be employed for converting N-doped beta tantalum to an oxidation product thereof, e.g., an oxide, is disclosed in U.S. Pat. No. 3,148,129. By masking the electrode 62, anodization of the electrode 62 is restricted to a preselected area.

Counterelectrode 66 may be deposited by vacuum evaporation of a conductive material, e.g., nichrome (80% Ni, 20% Cr) followed by gold, onto the dielectric film 64 through a suitable mask. It is to be noted that alternatively, counterelectrode 66 may be formed by evaporation followed by etching to shape. The dielectric film 64 separates and spaces the counterelectrode 66 from the base electrode 62 to form the capacitor 61.

Suitable N-doped beta tantalum capacitor films show increase in bulk resistivity, typically ranging from about 10 to about 50% higher than that of similarly deposited pure beta tantalum films, depending, of course, upon the degree of nitrogen incorporation. Also, the temperature coefficient of resistivity of nitrogen-doped beta tantalum films generally tend to be more negative than similarly deposited pure beta tantalum films. Although pure beta tantalum films can be fabricated into excellent capacitors, tests of capacitor reliability, capacitance density, environmental sensitivity, temperature coefficient of capacitance and dissipation factor show that capacitors produced from nitrogen-doped beta tantalum films are at least equal in these properties to their non-nitrogen-doped counterparts and can be considered as representative of an improvement thereover.

It is to be pointed out here and stressed that nitrogen-doped beta tantalum films producing good capacitors can be fabricated over a wide range of sputtering conditions. In other words, the processing parameters are not critical in producing high-quality capacitor films when nitrogen atoms (in controlled amounts) are introduced into the sputtering system. In this regard, it has been found that when such nitrogen-doped beta tantalum films are in the process of being deposited in a continuous sputtering machine, such as the closed-end machine described in U.S. Pat. No. 3,521,765, that a convenient relative measure of nitrogen content in the films may be determined by thermoelectric power measurements.

It is to be understood that although the thin-film capacitor 61 has an N-doped beta tantalum base electrode 62, other conductive materials may be used. For example, normal tantalum, beta tantalum, tantalum nitride, niobium, etc., may be employed. When another conductive material is employed as the base electrode 62, a thin film of N-doped beta tantalum is deposited over the electrode 62 and subsequently oxidized to form the dielectric film 64 of N-doped beta tantalum oxide. It is also to be understood that any process suitable for the fabrication of normal tantalum thin-film capacitors as well as beta tantalum thin-film capacitors may be used to fabricate N-doped beta tantalum thin-film capacitors.

In the communications industry, a useful criterion in meeting circuit requirements for capacitors is DC leakage current under specified test conditions. Tantalum thin film capacitors having a $Ta_2O_5$ dielectric layer, formed by anodizing a beta tantalum thin film (N-doped or undoped) in a room temperature anodizing electrolyte at 230 volts DC for 1 hour, have a capacitance density of about 56 nanofarads ($\pm 3\%$) per square centimeter of counterelectrode area. Such capacitors having DC leakage currents of less than 2 amperes per farad of capacitance with 55 volts DC applied for 15 seconds have been found to be reliable and suitable for device use.

A typical conventional leakage current test is carried out by applying 55 volts DC between the base electrode 62, e.g., N-doped beta tantalum electrode, and the counterelectrode 66, e.g., nichrome-gold, with the base electrode 62 biased positively with respect to the counterelectrode 66. The leakage current is measured by a suitable instrument 15 seconds after the voltage is applied. Tests conducted on nitrogen-doped beta tantalum film capacitors have low DC leakage levels and consistently high yields based on the above-described DC leakage current criteria which allows up to 2 amperes per farad of capacitance with 55 volts DC applied for 15 seconds.

EXAMPLE 1

A. A plurality of glass slides 4½ inches × 3¾ inches × 0.050 inch, commercially obtained, were each coated with an approximately 1,000A thick layer of thermally oxidized $Ta_2O_5$. The $Ta_2O_5$ layer was prepared by thermally oxidizing a 500A thick pure beta tantalum film for about 5 hours at 550° C in air. The $Ta_2O_5$ coated slide or substrate was then processed through a closed-end vacuum apparatus, of the type disclosed in U.S. Pat. No. 3,521,765, at a rate of 20 substrates/hour. Direct current sputtering of beta tantalum films having a thickness of about 4,000A was then carried out in three successive runs at a sputtering pressure of $30 \times 10^{-3}$ torr and a substrate temperature of 300° C. The sputtering conditions for these three runs were as follows:

| Run No. | Sputtering | Conditions | Nitrogen Doping Rate (cc/min.) | Argon Input Rate (cc/min.) | Film Deposition Rate (A/min.) |
|---|---|---|---|---|---|
|  | Voltage, Volts | Current, ma |  |  |  |
| 1 | 4200 | 500 | 0.8 | 45 | 190 |
| 2 | 4200 | 500 | None | 45 | 190 |
| 3 | 4200 | 500 | 0.8 | 45 | 190 |

The run numbers correspond to the chronological order of deposition runs. Thus, Run No. 1 was carried out first and Run No. 3 last. As can be seen from the above table, the three runs were identical except that the product of Run No. 2 was a pure undoped beta tantalum deposit.

A plurality of circuits comprising 10 capacitors each, similar to those described in FIGS. 3 and 4, having a total capacitance of 47 nanofarads per circuit were then fabricated. For each capacitor, the resultant deposited beta tantalum film (doped and undoped) was etched to shape by a conventional photolithographic technique to form a base electrode 62 of the capacitor 61 (FIGS. 3 and 4). The electrode 62 was suitably masked and anodized in a dilute (0.01 weight percent) citric acid solution maintained at 25° C, for one hour at 230 volts DC to form a dielectric film 64, comprising an oxidation product of N-doped beta tantalum. A counterelectrode 66, comprising a 500A adhesive layer of nichrome (80 weight percent Ni, 20 weight percent Cr) and a 10,000A layer of gold was evaporated on the dielectric film 64. The counterelectrode 66 was shaped to a desired configuration by a conventional photoresist and etching technique.

The circuits, each comprising ten resultant capacitors 61, were then subjected to a DC leakage current test by applying 55 volts DC between the base electrodes 62 (connected electrically in parallel) and the counterelectrodes 66. The base electrodes 62 were biased positively with respect to the counterelectrodes 66. The leakage current was then maeasured with a conventional instrument after 15 seconds of voltage impressment. This leakage current test of the circuits (containing 10 capacitors each) is more stringent than testing the individual capacitors themselves. Since each circuit has a total capacitance of 47 nanofarads, an allowable leakage current is $94 \times 10^{-9}$ amperes. The leakage current test results were as follows:

|  | Run No. 1 (Nitrogen Doping) | Run No. 2 (No Doping) | Run No. 3 (Nitrogen Doping) |
|---|---|---|---|
| Total No. of Circuits |  |  |  |

-continued

|  | Run No. 1 (Nitrogen Doping) | Run No. 2 (No Doping) | Run No. 3 (Nitrogen Doping) |
|---|---|---|---|
| Tested (10 capacitors/circuit) | 3299 | 882 | 1176 |
| Circuits With Leakage Less than $25 \times 10^{-9}$ amperes | 1910 (57.9%) | 21 (2.4%) | 830 (70.6%) |
| Circuits With Leakage 25 to $50 \times 10^{-9}$ amperes | 592 (17.9%) | 74 (8.3%) | 104 (8.8%) |
| Circuits with Leakage 50 to $93.5 \times 10^{-9}$ amperes | 145 (4.4%) | 72 (8.2%) | 25 (2.1%) |
| Circuit Yield, Percent | 80.2% | 18.9% | 81.5% |

B. A plurality of the substrates of Example I-A were processed at a speed of 20.5 substrate/hour through the in-line vacuum apparatus of Example I-A. Direct current sputtering of N-doped beta tantalum films (ca. 4,000A thick) was then carried out at a sputtering pressure of $30 \times 10^{-3}$ torr., in a gas ambient comprising argon and nitrogen (1.0 volume percent nitrogen, where the nitrogen was introduced into the system at a flow rate of 0.3 cc/min.), at a substrate temperature of 300° C, at a cathode voltage of 4,000 volts DC, at a cathode current of 420 ma, at a current density of 1.6ma/in.$^2$ and at a sputtering deposition rate of 150A a minute.

The resultant N-doped beta tantalum deposited substrates were then fabricated into capacitors as described in Example I-A. The nitrogen content of the nitrogen-doped capacitor films was calculated to range from 2.3 to 4.0 atomic percent for the plurality of samples sputtered under the above sputtering conditions.

C. The procedure of Example I-A was repeated with a plurality of substrates which were processed at a speed of 30 substrates/hour through the in-line vacuum apparatus of Example I-A. Direct current sputtering of N-doped beta tantalum films (ca. 4,000 A thick) was carried out at a sputtering pressure of $30 \times 10^{-3}$ torr., in a gas ambient comprising argon and nitrogen (2.7 volume percent nitrogen, where the nitrogen was introduced into the system at a flow rate of 1.2 std. cc/minute), at a substrate temperature of 350° C, at a cathode voltage of 4,500 volts DC, at a cathode current of 800 ma, at a current density of 2.9 ma/in.$^2$ and at a sputtering deposition rate of 300A/minute.

The resultant N-doped beta tantalum deposited substrates were then fabricated into capacitors as described in Example I-A. The nitrogen content of the nitrogen-doped capacitor films was calculated to range from 4.8 to 7.9 atomic percent for the plurality of samples sputtered under the above sputtering conditions.

EXAMPLE II

A. A sputtering apparatus similar to that shown in FIG. 1 was used to sputter a nitrogen-doped beta tantalum film 18 on a substrate 15 of Example I-A. The cathodic array 21 of the apparatus 17 comprised six 9 inch long × ⅜ inch diameter high purity tantalum elements 22-22', spaced 1-9/16 inches apart, center to center. The sputtering chamber 19 was evacuated to a pressure of $2 \times 10^{-6}$ torr. after flushing with argon gas. A gaseous mixture comprising argon and nitrogen was then admitted through inlet 53 into the sputtering chamber 19 at a flow rate of 25 cc/min. to raise the pressure to $30 \times 10^{-3}$ torr. The N$_2$ was mixed with the argon gas from source 57 at a flow rate of 0.6 cc/minute, whereby a nitrogen gas concentration of 2.3 percent by volume of the resultant gaseous mixture of argon and nitrogen was established.

The substrate 15 was maintained at a temperature of 200° C and sputtering was carried out at a cathode voltage of 5,000 volts AC, a cathode current of 500 ma, a field bias voltage of −200 volts DC, and a field bias current of 240 ma. After 12 minutes, a 3,840A sputtered nitrogen-doped beta tantalum film 18 was obtained on the thermally grown Ta$_2$O$_5$ layer of the substrate 15. The resultant N-doped beta tantalum film 18 had a nitrogen content of at least 3.5 atom percent as determined by spectrophotometric analysis.

B. The procedure of Example II-A was repeated except that a plurality of the N-doped beta tantalum film deposited substrates of Example II-A were obtained and used in the fabrication of a plurality of capacitors similar to that described in FIGS. 3 and 4.

The resultant plurality of N-doped beta tantalum capacitors were each subjected to a potential of 50 volts DC for one minute at a temperature of 25° C, whereby leakage current measurements were undertaken. An average leakage current of $0.37 \times 10^{-9}$ amperes per device was exhibited by the capacitors. An acceptable leakage current under such conditions is $11 \times 10^{-9}$ amperes/device.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of forming a tantalum body comprising tantalum atoms, having nitrogen atoms related therewith in a beta tantalum crystal structure only, deposited on a surface of a substrate, which comprises:
   reactively sputtering a plurality of discrete tantalum atoms from a tantalum source in a nitrogen containing ambient
   in a ratio ranging from about 9 to about 999 atoms of tantalum to one atom of nitrogen to form only a beta tantalum crystal structure, to form the tantalum body; and
   depositing said tantalum body on the surface of the substrate.

2. A method of depositing a film, comprising nitrogen-doped beta tantalum, on a surface of a substrate, which comprises the steps of:
   a. respectively sputtering tantalum atoms with nitrogen atoms to combine them in a ratio of tantalum atoms to nitrogen atoms ranging from about 9/1 to about 999/1 to form only a beta tantalum crystalline structure; and b. depositing said combined atoms on the surface of the substrate to deposit the film.

3. A method of depositing a metallic film comprising a beta tantalum crystalline structure, having nitrogen atoms incorporated therein with tantalum atoms, on a surface of a substrate, which comprises:

a. maintaining a cathodic source comprising tantalum, an anode and the substrate, which is contiguous to said cathodic source and said anode, in a low pressure gas ambient comprising an inert gas and a nitrogen-atom containing reactive gas; and b. applying a reactive sputtering potential between said cathodic source and said anode to (1) sputter tantalum particles from said cathodic source, (2) combine said sputtered particles with nitrogen atoms of said reactive gas in a ratio ranging from about 9 to about 999 atoms of tantalum to one atom of nitrogen to form only a beta tantalum crystalline phase, and (3) deposit said combined particles and atoms on the surface of the substrate to deposit the film.

* * * * *